United States Patent
Mah

(10) Patent No.: US 8,546,942 B2
(45) Date of Patent: Oct. 1, 2013

(54) FLIP-CHIP SEMICONDUCTOR DEVICE HAVING ANISOTROPIC ELECTRICAL INTERCONNECTION AND SUBSTRATE UTILIZED FOR THE PACKAGE

(75) Inventor: Hian-Hang Mah, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 13/450,188

(22) Filed: Apr. 18, 2012

(65) Prior Publication Data

US 2013/0026625 A1 Jan. 31, 2013

(30) Foreign Application Priority Data

Jul. 26, 2011 (TW) .............................. 100126463 A

(51) Int. Cl.
*H01L 23/48* (2006.01)
(52) U.S. Cl.
USPC ....... 257/737; 257/668; 257/780; 257/E23.01

(58) Field of Classification Search
USPC ................ 257/692–700, 737, 758–760, 778, 257/785, 688, E23.01
See application file for complete search history.

*Primary Examiner* — Steven Loke
*Assistant Examiner* — Juanita B Rhodes
(74) *Attorney, Agent, or Firm* — Muncy, Geissler, Olds & Lowe, PLLC

(57) ABSTRACT

Disclosed is a flip-chip semiconductor device having isotropic electrical interconnection, primarily comprising a chip and a substrate. The chip has at least a first bump and a plurality of second bumps. The substrate has a plurality of bump pads disposed on the top surface and an isotropic connecting mechanism disposed inside the substrate consisting of a plurality of terminals electrically isolated from each other and a flexible vertical pad protruded from the top surface, wherein the disposition locations of the terminals circle around the flexible vertical pad as a disposition center. When the second bumps of the chip are bonded onto the corresponding bump pads, the first bump presses and bends the flexible vertical pad in a specific horizontal direction so that the flexible vertical pad selectively and electrically connect to a selected one of the terminals.

10 Claims, 4 Drawing Sheets

FLIP-CHIP SEMICONDUCTOR DEVICE HAVING ANISOTROPIC ELECTRICAL INTERCONNECTION AND SUBSTRATE UTILIZED FOR THE PACKAGE

FIELD OF THE INVENTION

The present invention relates to a semiconductor device, and more specifically to a flip-chip semiconductor device with anisotropic electrical interconnection and the substrate utilized for the device.

BACKGROUND OF THE INVENTION

Flip-chip bonding is a well-known and mature chip bonding technology where a plurality of bumps are disposed on a chip, then bonded on the corresponding connecting pads of a substrate without extra wire-bonding space to meet the requirements of miniaturization and high-density I/O. However, the conventional wire bonding technology can change the pin assignment of a chip through bonding options. But the interconnection between flip-chip bumps and corresponding bonding pads are point-to-point connections which are fixed during flip-chip bonding processes so that pin assignment of a chip can not be changed. When a semiconductor device with different pin assignment is fabricated, the only solution is to redesign the substrate circuitry.

SUMMARY OF THE INVENTION

The main purpose of the present invention is to provide a flip-chip semiconductor device with anisotropic electrical interconnection and a substrate utilized for the device to integrate the advantages of flip-chip bonding and wire bonding so that pin assignment of a chip can be changed during flip-chip bonding processes to make the substrate become a common board for semiconductor devices with different pin assignment, i.e., different functions.

According to the present invention, a flip-chip semiconductor device with anisotropic electrical interconnection is revealed in the present invention, primarily comprising a chip and a substrate. The chip has at least a first bump and a plurality of second bumps. The substrate has a top surface and a plurality of horizontal bump pads disposed on the top surface. At least an isotropic connecting mechanism is disposed inside the substrate consisting of a plurality of terminals which are electrically insulated from each other and a flexible vertical pad protruded from the top surface, wherein the disposition locations of the terminals circle around the flexible vertical pad as a disposition center. When the second bumps of the chip are bonded onto the corresponding horizontal bump pads, the first bump presses and bends the flexible vertical pad in a specific horizontal direction so that the flexible vertical pad selectively connect to a selected one of the terminals.

Accordingly, through the flip-chip semiconductor device with anisotropic electrical interconnection as a technical mean, the advantages of flip-chip bonding and wire bonding can be integrated so that pin assignment can be changed during flip-chip bonding processes to make the substrate become a common board for semiconductor devices with different pin assignment.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
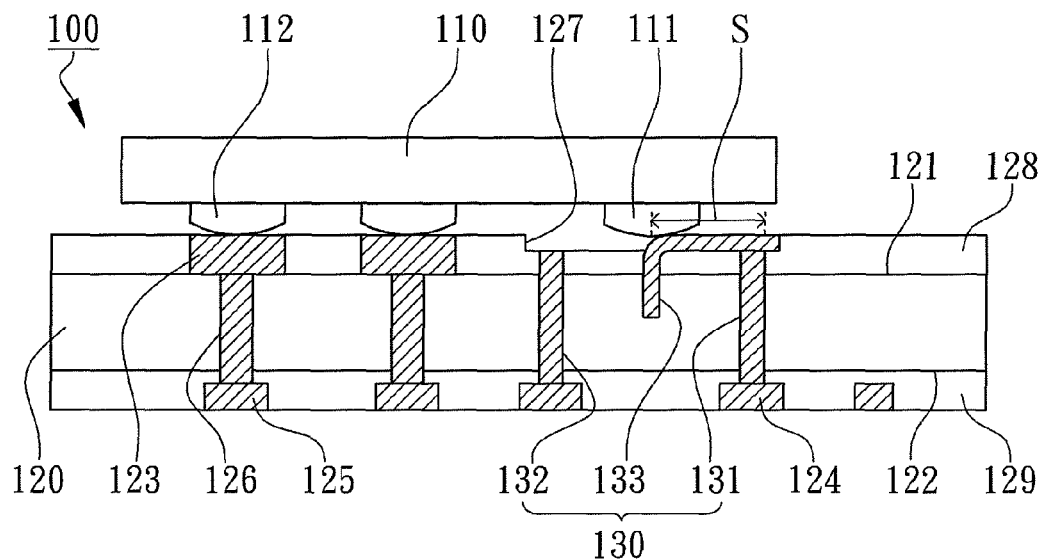
FIG. 1 is a cross-sectional view of a flip-chip semiconductor device with anisotropic electrical interconnection illustrating the electrical connection in a first horizontal direction according to the preferred embodiment of the present invention.
Figure 2:
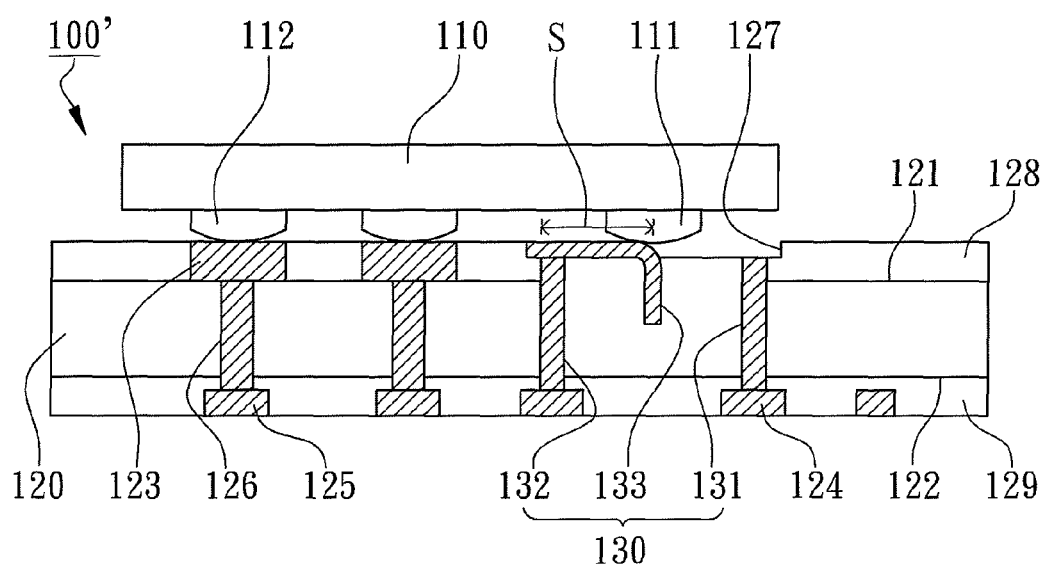
FIG. 2 is a cross-sectional view of the flip-chip semiconductor device illustrating the electrical connection in a second horizontal direction according to the preferred embodiment of the present invention.
Figure 3:
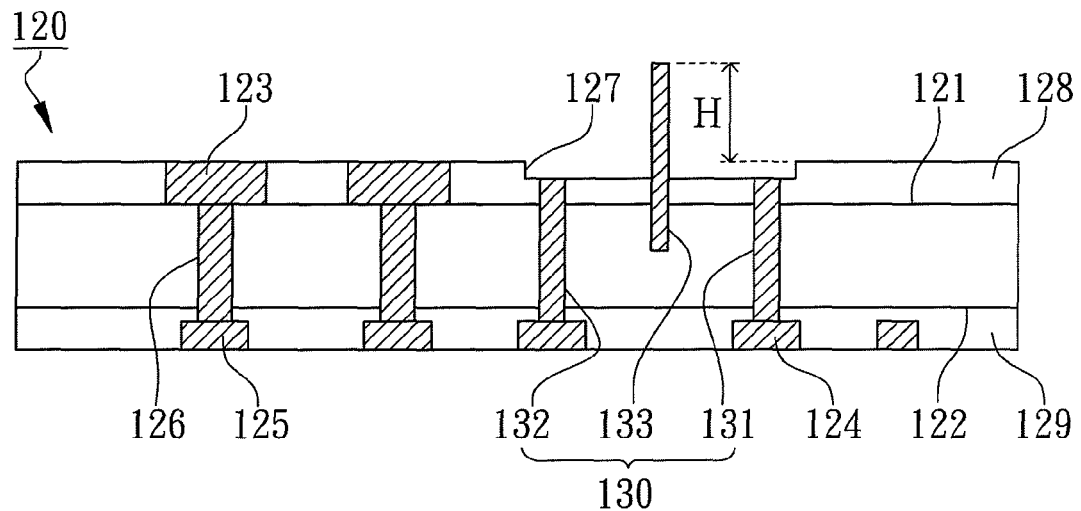
FIG. 3 is a cross-sectional view of a substrate implemented in the flip-chip semiconductor device illustrated in FIG. 1 according to the preferred embodiment of the present invention.
Figure 4:
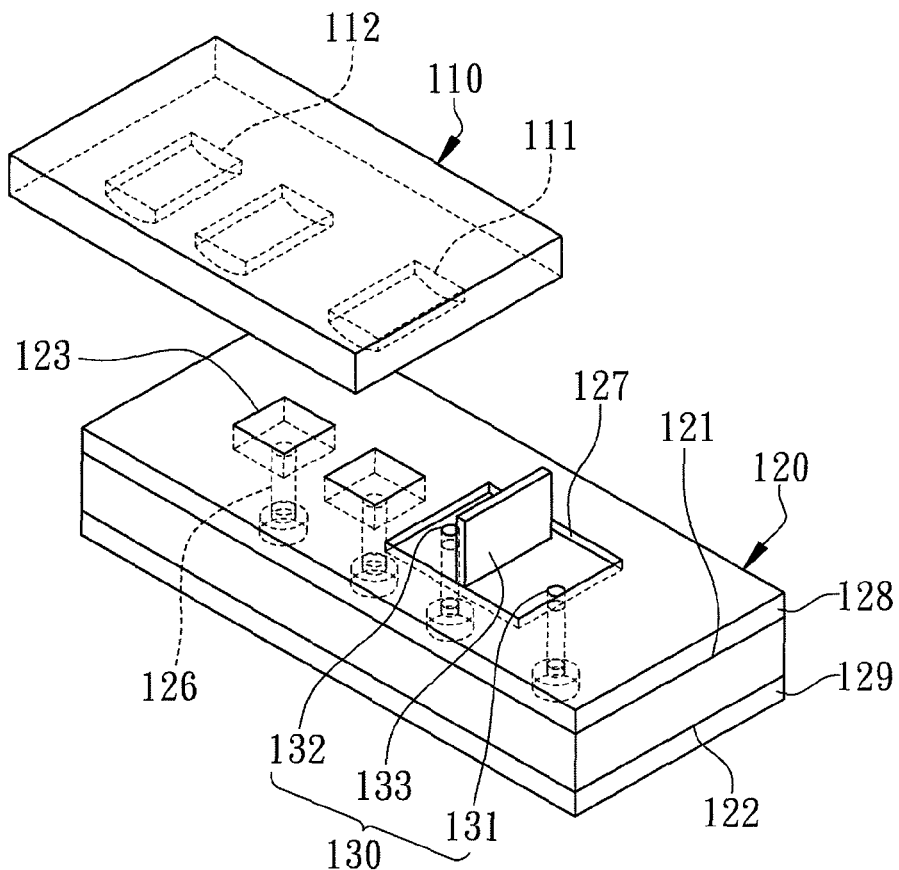
FIG. 4 is a three-dimensional view illustrating a first bump and a flexible vertical pad in the flip-chip semiconductor device with anisotropic electrical interconnection according to the present invention.

According to the first embodiment of the present invention, a flip-chip semiconductor device 100 with anisotropic electrical interconnection is illustrated in FIG. 1 for a cross-sectional view of the electrical connection in the first direction and in FIG. 2 for a cross-sectional view illustrating the electrical connection in the second direction. The flip-chip semiconductor device 100 primarily comprises a chip 110 and a substrate 120 where the three-dimensional views of the chip 110 and the substrate 120 are shown in FIG. 4. The chip 110 has at least a first bump 111 and a plurality of second bumps 112. The substrate 120 has a top surface 121 where a plurality of horizontal bump pads 123 are disposed on the top surface 121 of the substrate 120. The substrate 120 implemented in the flip-chip semiconductor device 100 as revealed in the present invention is shown in FIG. 3 for a cross-sectional view.

The chip 110 is made of semiconductor materials with various IC circuitry fabricated on the active surface. The first bump 111 and the second bumps 112 are external electrical terminals for the internal IC circuitry fabricated inside the chip 110. The substrate 120 is a chip carrier for the chip 110 where the substrate 120 can be a printed circuit board, a ceramic substrate, or a pre-mold leadframe. Moreover, when the semiconductor device 100 is implemented in a semiconductor product, the substrate 120 further has a bottom surface 122 where a plurality of first external pads 124 are disposed on the bottom surface 122 and a plurality of second external pads 125 are also disposed on the bottom surface 122. And the first external pads 124 are electrically connected to the corresponding terminals 131 and 132 and the second external pads 125 are electrically connected to the horizontal bump pads 123.

Furthermore, the substrate 120 further has at least an isotropic connecting mechanism 130 disposed inside the substrate 120. The isotropic connecting mechanism 130 includes a plurality of terminals 131 and 132 which are electrically isolated from each other and a flexible vertical pad 133 protruded from the top surface 121. Therein, the disposition locations of the terminals 131 and 132 circle around the flexible vertical pad 133 as a disposition center. In other words, the location of the flexible vertical pad 133 is the disposition center of a circle where the terminals 131 and 132 are disposed at the corresponding periphery of the circle so that the distances from the terminals 131 and 132 to the flexible vertical pad 133 are about the same. In the present embodiment, the flexible vertical pad 133 may be a copper flake with plated Au or Tin finish. Before flip-chip bonding processes, the flexible vertical pad 133 does not electrically connect to the terminals 131 nor 132. In a more specific embodiment, the terminals 131 and 132 further include a plurality of first via holes where the ends of the terminals 131 and 132 at the bottom surface 122 are electrically connected to the first external pads 124. To be more specific, the substrate 120 further has a plurality of second via holes 126 where both ends of the second via holes 126 are electrically connected to the corresponding second external pads 125 and the horizontal hump pads 123 respectively. Therefore, the circuitry disposed on the top surface 121 of the substrate 120 in the aforementioned package structure can be eliminated and the circuitry disposed on the bottom surface 122 of the substrate 120 can also be eliminated or simplified.

As shown in FIGS. 1 and 2, when the second bumps 112 of the chip 110 are bonded to the horizontal bump pads 123, the first bump 111 presses and bends the flexible vertical pad 133 in a specific horizontal direction to selectively and electrically connect to a selected one of the terminals 131 or 132. Moreover, the shape and material of the first bump 111 are preferably the same as the second bumps 112 to reduce the bumping cost. In the present embodiment, as shown in FIG. 4, the first bump 111 is a finger-shaped bump (i.e., the length is not less than twice of the width) made of Cu, a low-cost bump material. Preferably, the extruded edge of the first bump 111 is arc for easy pressing and bending the flexible vertical pad 133.

Figure 5:
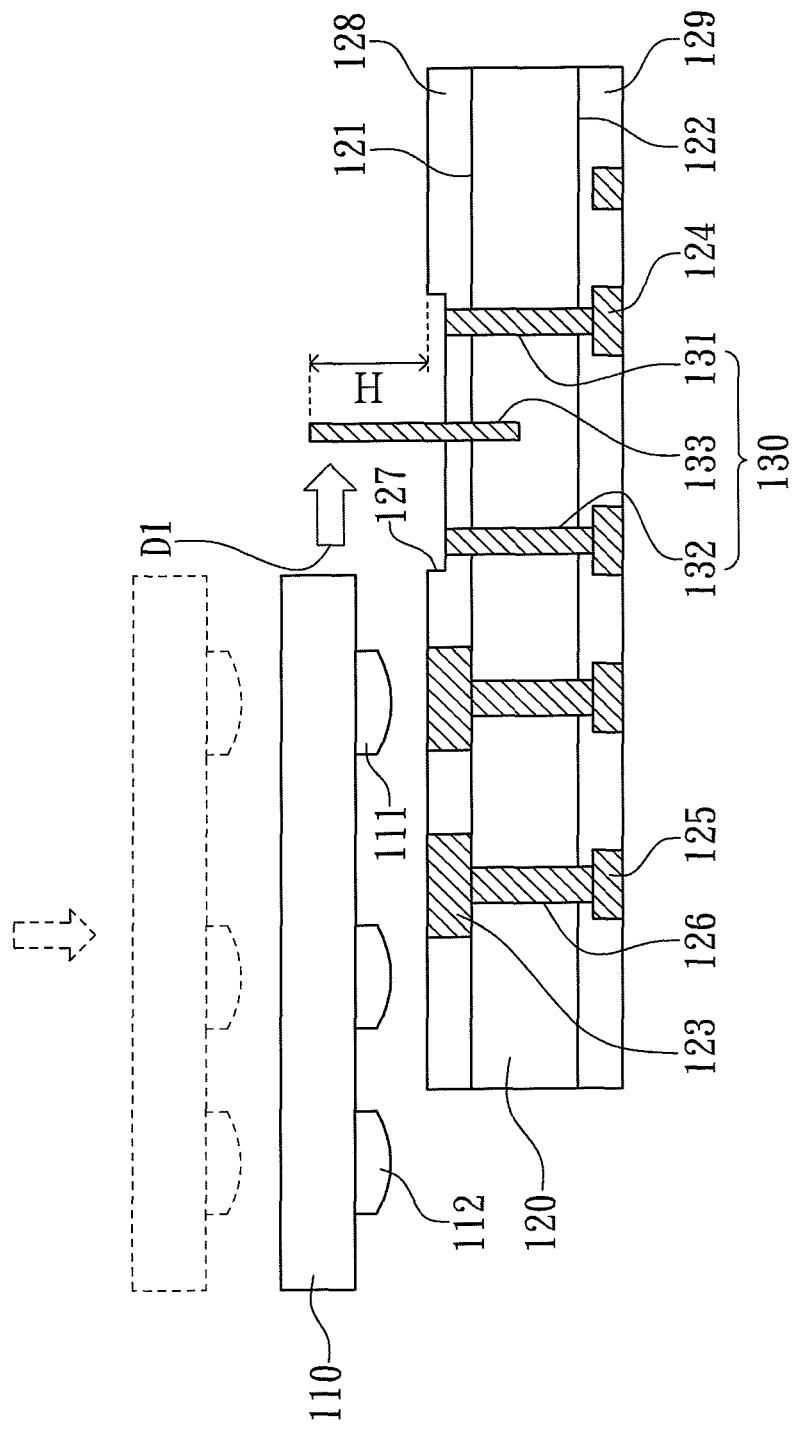
FIG. 5 is a cross-sectional view illustrating a flip-chip bonding process in the first horizontal direction for fabricating the flip-chip semiconductor device as shown in FIG. 1 according to the preferred embodiment of the present invention.

In the present embodiment, as shown in FIG. 5, the chip 110 is moved downward to a certain height without contacting the horizontal bump pads 123 of the substrate 120 to position the first bump 111 lower than the extruded height H of the flexible vertical pad 133. Then, the chip 110 is moved from left to right in the first horizontal direction D1 as shown in FIG. 5 to enable the first bump 111 press and bend the flexible vertical pad 133 to the right to make electrically connection to the selected terminal 131 where the rest of the terminals 132 are kept in electrical isolation, i.e., the first external pads 124 of any unselected terminals 132 are kept as NC pins and the second bumps 112 are bonded to the corresponding horizontal bump pads 123 as signal pins to achieve fixing the chip 110 to complete the packaging of the flip-chip semiconductor device 100 as shown in FIG. 1. The interconnection between the second bumps 112 and the corresponding horizontal bump pads 123 can be made by soldering or by metal-to-metal bonding such as Au-to-Au bonding, Au-to-Tin bonding, or Tin-to-Cu bonding. Due to the flexibility of the flexible vertical pad 133, the first bump 111 can be electrically connected with the flexible vertical pad 133 by simply physical contact or by a small amount of solder paste where the interconnection between the flexible vertical pad 133 after bending and the selected terminal 133 can be made by soldering.

Figure 6:
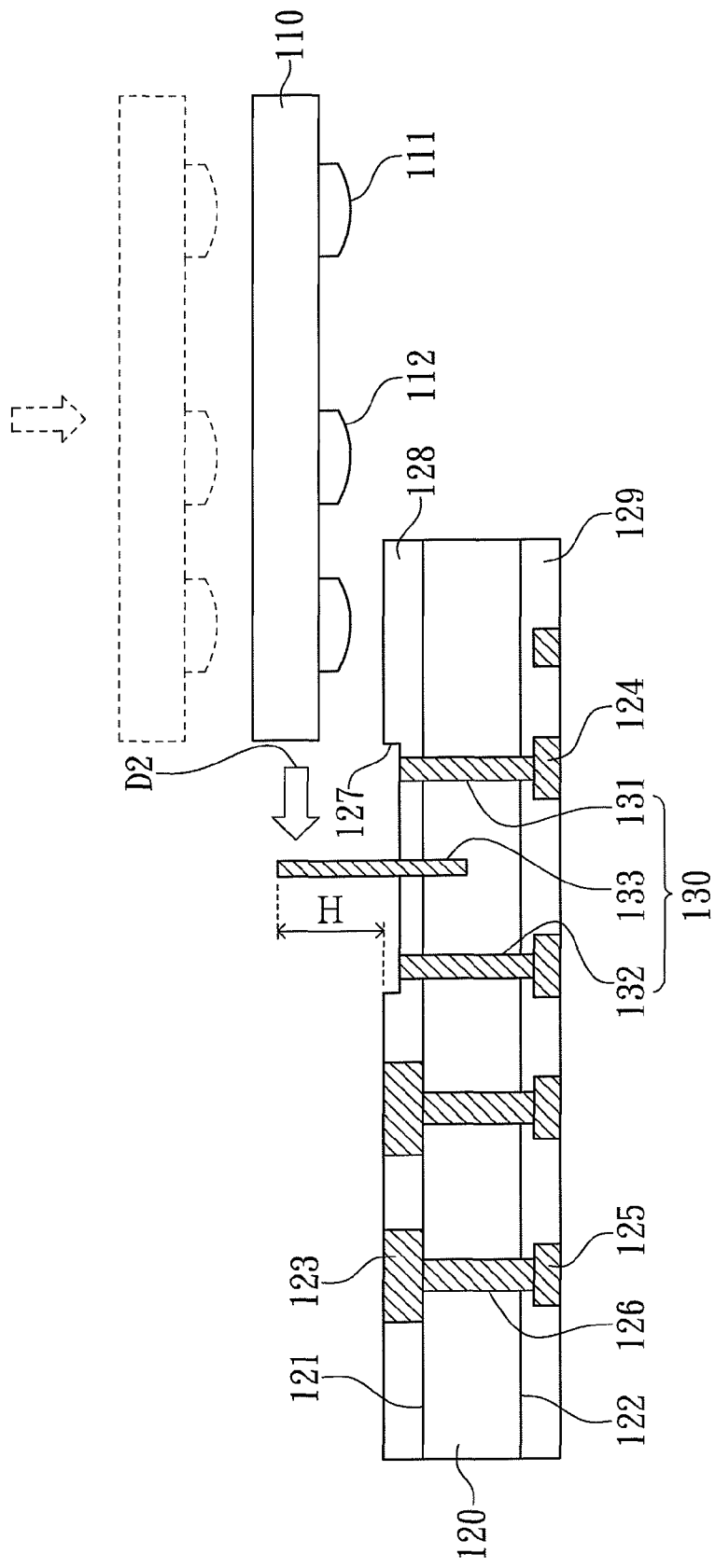
FIG. 6 is a cross-sectional view illustrating a flip-chip bonding process in the second horizontal direction for fabricating a flip-chip semiconductor device as shown in FIG. 2 according to the preferred embodiment of the present invention.

As shown in FIG. 6, when the chip 110 is moved downward to a certain height without contacting the horizontal hump pads 123 of the substrate 120 to position the first bump 111 lower than the extruded height H of the flexible vertical pad 133. Then, the chip 110 is moved from right to left in the second horizontal direction D2 to enable the first bump 111 to press and bend the flexible vertical pad 133 to the left to make electrical connection to the selected terminal 132 where the rest of the terminals 131 are kept in electrical isolation, i.e., the first external pads 124 of any unselected terminals 131 are kept as NC pins and the second bumps 112 are bonded to the corresponding horizontal bump pads 123 to achieve fixing the chip 110 to complete the packaging of the flip-chip semiconductor device 100' as shown in FIG. 2. Preferably, the first bump 111 is aligned to the flexible vertical pad 133 and keeps a horizontal distance S from every terminals 131 and 132 where the distance S is not greater than the extruded height H of the flexible vertical pad 133 to ensure the bent flexible vertical pad 133 can electrically connect to the selected terminals 131 or 132.

Therefore, even though the components of the afore described flip-chip semiconductor devices 100 and 100' are the same, but the electrical connections of the chip 110 to the external pads 124 and 125 are different through the adjustment of the operation parameters to create the electrical interconnection flexibility during flip-chip bonding processes. Therefore, the advantages of flip-chip bonding and wire bonding are integrated in the present invention so that pin assignment can be changed during flip-chip bonding processes to make the substrate 120 become a common board for semiconductor devices 100 and 100' with different pin assignment, i.e., different functions.

Preferably, the substrate 120 further has a pad cavity 127 formed on the top surface 121 to accommodate the bent flexible vertical pad 133 to avoid the breaking of the flexible vertical pad 133 due to over-bending. The pad cavity 127 can be formed from a solder resist opening to reduce the cost of forming the pad cavity 127. In the present embodiment, a first solder resist 128 is disposed on the top surface 121 where the first solder resist 127 has an opening to form the pad cavity 127. Moreover, when implemented in semiconductor packages, a second solder resist 129 can be disposed on the bottom surface 122 of the substrate 120 to protect the bottom surface 122 with the first external pads 124 and the second connecting pads 125 exposed from the second solder resist 129.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A substrate implemented in a flip-chip semiconductor device with anisotropic electrical interconnection, the substrate having a top surface, a plurality of horizontal bump pads disposed on the top surface and at least an isotropic connecting mechanism disposed inside the substrate, wherein the isotropic connecting mechanism includes a plurality of terminals electrically isolated from each other and a flexible vertical pad protruded from the top surface, wherein the disposition locations of the terminals circle around the flexible vertical pad as a disposition center.

2. The substrate as claimed in claim 1, wherein the substrate further has a pad cavity formed on the top surface for accommodating the flexible vertical pad.

3. The substrate as claimed in claim 2, wherein the pad cavity is formed from a solder resist opening.

4. A flip-chip semiconductor device with anisotropic electrical interconnection, comprising:
   a chip having at least a first bump and a plurality of second bumps; and
   a substrate having a top surface, a plurality of horizontal bump pads disposed on the top surface and at least an isotropic connecting mechanism disposed inside the substrate, wherein the isotropic connecting mechanism includes a plurality of terminals electrically isolated from each other and a flexible vertical pad protruded from the top surface, wherein the disposition locations of the terminals circle around the flexible vertical pad as a disposition center, wherein the first bump presses and bends the flexible vertical pad in a specific horizontal direction so that the flexible vertical pad selectively and electrically connects to a selected one of the terminals when the second bumps are bonded onto the corresponding horizontal bump pads.

5. The flip-chip semiconductor device as claimed in claim 4, wherein the substrate further has a bottom surface, a plurality of first external pads and a plurality of second external pads disposed on the bottom surface, wherein the first external pads are electrically connected to the corresponding terminals and the second external pads are electrically connected to the horizontal bump pads.

6. The flip-chip semiconductor device as claimed in claim 5, wherein the terminals include a plurality of first via holes in the substrate, wherein a plurality of ends of the terminals at the bottom surface are electrically connected with the first external pads.

7. The flip-chip semiconductor device as claimed in claim 6, wherein the substrate further has a plurality of second via holes, wherein both ends of the second via holes are electrically connected to the corresponding second external pads and the horizontal bump pads respectively.

8. The flip-chip semiconductor device as claimed in claim 4, wherein the substrate further has a pad cavity formed on the top surface to accommodate the bent flexible vertical pad.

9. The flip-chip semiconductor device as claimed in claim 8, wherein the pad cavity is formed from a solder resist opening.

10. The flip-chip semiconductor device as claimed in claim 4, wherein the first bump is aligned to the flexible vertical pad and there is a constant horizontal distance kept between the first bump and the terminals wherein the horizontal distance is not greater than the extruded height of the flexible vertical pad.

* * * * *